United States Patent
Burgess

(10) Patent No.: US 10,673,768 B2
(45) Date of Patent: Jun. 2, 2020

(54) MANAGING DATA COMPRESSION

(71) Applicant: Bridgeworks Limited, Hampshire (GB)

(72) Inventor: Paul Burgess, Hampshire (GB)

(73) Assignee: Bridgeworks Limited, Hampshire (GB)

( * ) Notice: Subject to any disclaimer, the term of this patent is extended or adjusted under 35 U.S.C. 154(b) by 0 days.

(21) Appl. No.: 16/144,089

(22) Filed: Sep. 27, 2018

(65) Prior Publication Data
US 2019/0104077 A1 Apr. 4, 2019

(30) Foreign Application Priority Data

Sep. 29, 2017 (GB) .................................. 1715802.3

(51) Int. Cl.
*H04L 12/835* (2013.01)
*H03M 7/30* (2006.01)
*H04L 29/06* (2006.01)

(52) U.S. Cl.
CPC .............. *H04L 47/30* (2013.01); *H03M 7/30* (2013.01); *H03M 7/6064* (2013.01); *H04L 69/04* (2013.01)

(58) Field of Classification Search
USPC ........................................................ 709/247
See application file for complete search history.

(56) References Cited

U.S. PATENT DOCUMENTS

| 2003/0090397 | A1* | 5/2003 | Rasmussen | ................ G06T 9/00 341/51 |
| 2007/0115964 | A1* | 5/2007 | Srinivasan | ............... H04L 47/38 370/389 |
| 2007/0291751 | A1 | 12/2007 | Smith et al. | |
| 2009/0052420 | A1 | 2/2009 | Fischer | |
| 2009/0150942 | A1 | 6/2009 | Nakano | |
| 2012/0259989 | A1 | 10/2012 | Cousins | |
| 2013/0094356 | A1 | 4/2013 | Keith et al. | |
| 2014/0269774 | A1* | 9/2014 | Callard | ................... H04L 69/04 370/477 |
| 2015/0156284 | A1 | 6/2015 | Akhter et al. | |
| 2015/0249610 | A1 | 9/2015 | Kanamarlapudi et al. | |

(Continued)

OTHER PUBLICATIONS

Office Action dated Feb. 27, 2018 of Application No. GB1715802.3.

*Primary Examiner* — Hermon Asres
(74) *Attorney, Agent, or Firm* — Banner & Witcoff, Ltd.

(57) ABSTRACT

A transmitting apparatus is provided for transmitting data to a receiving apparatus, the transmitting apparatus comprising: a first network interface configured to transmit data to the receiving apparatus over a first communications path; a transmit buffer forming part of the first network interface, the transmit buffer being configured to store a series of packets of data for transmission over the first communications path; a data compression module configured to compress at least some of the packets of data stored for transmission; a second network interface configured to receive a decompression rate value from the receiving apparatus over a second communications path; and wherein the apparatus is configured to select data packets stored in the transmit buffer for compression based on a compression rate value and a transmission rate value of the transmitting apparatus and a decompression rate value received from the receiving apparatus via the second network interface. A receiving apparatus is also provided.

20 Claims, 6 Drawing Sheets

(56) References Cited

U.S. PATENT DOCUMENTS

| | | |
|---|---|---|
| 2015/0256653 A1 | 9/2015 | Ambriss et al. |
| 2015/0295652 A1 | 10/2015 | Luo et al. |
| 2015/0304441 A1 | 10/2015 | Ichien |
| 2017/0012641 A1 | 1/2017 | Lee |
| 2017/0093947 A1* | 3/2017 | Smith .............. H04N 21/23805 |
| 2017/0123704 A1 | 5/2017 | Sharma et al. |

* cited by examiner

MANAGING DATA COMPRESSION

FIELD

The specification relates to managing data compression.

BACKGROUND

Data compression is a process widely used to reduce the number of bytes that construct data over a predefined length. This can be done in many ways; however the fundamental method requires recognising patterns of data and representing them with smaller digital lookups or symbols. This method removes as much redundant information as possible without compromising data integrity or generating a loss of information. It is most effective when the original data block contains highly repetitive patterns. For example, a database containing dates and addresses can have all common words symbolised, such as January, February or March. Where instead of storing words, the symbol '1', '2' or '3' can be used. In addition common number sequences can also be symbolised, such as postal codes or years.

Compression can be used to reduce the amount of storage required to store data; to increase the perceived throughput when transferring data from one location to another; and to reduce repeating patterns before performing an encryption process on a particular data set.

Compression can be used wherever data contains redundant information, such as emails, documents and databases. All of which have repetitive elements, such as the spaces between words in a document, formatting information or repeating data patterns such as numbers in a spreadsheet. A good example of where compression is used in industry is within newspaper companies, where words and sentences are used and reused hundreds or thousands of times making it easy to take these commonly used words and store them in an optimised manner.

The benefits of data compression may only go as far as the quality of the data being compressed. If the data has a lot of repeating patterns then the effects will result in a faster compression rate as well as a smaller data payload. For example, if a data payload contains only one recognised pattern then it is easy to identify that pattern repeatedly and re-encode the data. However if this data payload was full of hundreds of patterns to be recognised then every pattern lookup will take longer and the re-encoded data will have to contain all of these patterns and the order that they occurred within that payload. If the data has no repeating patterns then the compression time will be longer because the compression algorithm will be continuously looking and storing potential patterns, and as a result the re-encoded data size could be even larger than the original.

Data compression is not used on data where the level of redundancy is low. This includes data that has been encrypted or is already compressed, simply because reducing redundant information is one of the main purposes of these operations. Video files, for example, have usually gone through a compression process and so would not compress well. Another example of data that are not easily compressible would be medical images, which are generally encrypted for data protection.

The rate that data can be compressed is dependent on three elements: the algorithm used for the process, the hardware performing the process and the quality of the data being processed.

There are many different compression algorithms available, each having a different level of efficiency and performance. Although this level differs from one algorithm to the next it is constant. This means that if the same data set were to be processed multiple times it would take exactly the same number of operations to run the process, outputting the same data payload each time. Even if the data set differed, as long as it is of the same quality or compressibility then the number of operations to run the process and the compression efficiency of the output will be relatively similar for a given algorithm.

The hardware performing a compression operation could have a single processing core, 32 processing cores or even hardware offloading to improve system performance. Regardless of what the hardware is or how fast it can run, the amount of time that it takes to run an operation is constant.

The data that goes through a compression process is the most changeable element that influences the performance. On a given system, using a predefined algorithm, the amount that the data can be compressed will differ from one set to the next. As stated above, if a data set has a lot of redundant information then the overall process will be faster than if the data had very little redundancy.

In summary, the rate of compression is directly proportional to the performance of the hardware, the algorithm used and the quality (or compressibility) of the data.

Performing data compression is a very computationally intensive task. If a compression algorithm has the ability to run on multiple CPUs then it has the potential to consume a large amount of a system's resources, leaving little or no processing time for performing other operations in the system. This can be a problem if a system has multiple roles to perform, especially if any of these roles are time critical.

Some compression methods can only utilise a single core because of the sequential processing method used on a file or a stream of data. Where such a compression algorithm is used the maximum rate of compression is limited to the speed of that core, irrespective of how many cores are available within the system. Under this scenario running other operations in the system is generally not a problem, limitations occur when other operations are dependent on the compressed data such as a transmission system.

Some servers use compression in conjunction with a network to perform backup or remote copy operations. These systems sometimes work in pairs, where the data is compressed, sent, received and then decompressed. Other systems may compress the data before sending it to a network storage device, such as NFS, Block iSCSI or a Windows file share. In each of these cases the server depends on the data being compressed before transmitting it.

Network Interface cards (NICs) are increasing in speed such as 1 Gb, 10 Gb or 40 Gb, yet the input/output (I/O) interface and protocol to the computer system generally remain the same. This means that a computer administrator can simply replace a NIC to either gain network performance or to keep compatibility with an evolving network infrastructure.

If a system, such as one of the examples above using compression prior to sending data, were to have its NIC upgraded to accommodate a faster network infrastructure then it may be that the actual gain is negligible. This could be if all of the available processing time is already being used for compression, leaving only a small amount of resources to perform the network operations. Similarly, because the compressed data from this system is to be transmitted after compression then the result of replacing the NIC could show zero increase in performance if the limiting factor is the time to compress the data prior to transmission.

Tests have shown that a computer system running an Intel Xeon X5660 Hex Core 2.8 GHz processor, which has 6 cores, can compress data to 24% in size at a rate of 411 MB/s when utilising all cores. This means that compressing this data before transmitting it over a 1 Gb network link can increase the perceived user throughput by a factor of 4, making it look like the network link is 4 Gb/s just by sending less data. Doing this is beneficial to the overall system. However, if the same system has the NIC upgraded to 10 Gb/s then the throughput would still be 411 MB/s, utilising none of the additional network performance available. This is simply because the limiting factor is now the compression process. Under this scenario the compression process is not beneficial but a problem because it is slowing down the potential transfer rate of the data, where a 10 Gb network link can reach a perceived user throughput of 1280 MB/s, which is now limited to 411 MB/s (down to 32% of the network).

The problem being identified can be seen all over the world as a result of network links over distance becoming both cheaper and faster. When network links were slower and more expensive, compression was used in series with network transmission as a way to give users the perception of a faster link by reducing the amount of data being transferred. As network links have increased in speed that compression process has become a limiting factor. This has resulted in compression limiting the performance to such a point that the network utilisation drops to below 100% despite a reduction in data quantity.

SUMMARY

A first aspect of this specification provides a transmitting apparatus for transmitting data to a receiving apparatus, the transmitting apparatus comprising: a first network interface configured to transmit data to the receiving apparatus over a first communications path; a transmit buffer forming part of the first network interface, the transmit buffer being configured to store a series of packets of data for transmission over the first communications path; a data compression module configured to compress at least some of the packets of data stored for transmission; a second network interface configured to receive a decompression rate value from the receiving apparatus over a second communications path; and wherein the apparatus is configured to select data packets stored in the transmit buffer for compression based on a compression rate value and a transmission rate value of the transmitting apparatus and a decompression rate value received from the receiving apparatus via the second network interface.

The compression module may be configured to determine whether the compressed size of a particular data packet exceeds the uncompressed size of the data packet.

The apparatus may be configured to vary the transmit buffer size.

The transmit buffer size may be varied dependent on the compression rate and the transmission rate.

The transmit buffer size may be varied in response to a determination that the buffer swing is above a predetermined threshold.

Varying the transmit buffer size may comprise increasing the transmit buffer size in response to a determination that the transmission rate is above a transmission rate threshold.

The apparatus may be configured to cause a variation in the receive buffer size of the receiving apparatus.

The variation in the receive buffer size may be based on the rate at which the receive buffer is able to offload received data packets.

A second aspect of this specification provides a receiving apparatus for receiving data from a transmitting apparatus, the receiving apparatus comprising: a first network interface configured to receive a series of packets of data from the transmitting apparatus over a first communications path; a receive buffer forming part of the first network interface, the receive buffer being configured to uncompressed ones of the packets of data received over the first communications path; a data decompression module configured to decompress compressed ones of the packets of data received over the first communications path before the resulting decompressed packets of data are provided to the receive buffer; and a second network interface configured to send a decompression rate value to the transmitting apparatus over a second communications path.

The receive buffer may be configured to be resized in response to determining that a transmit buffer does not meet a size requirement.

A third aspect of this specification provides a system comprising the transmitting apparatus and the receiving apparatus.

A fourth aspect of this specification provides a method of transmitting data from a transmitting apparatus to a receiving apparatus, the method comprising: storing a series of packets of data for transmission over a first communications path in a transmit buffer; receiving a decompression rate value from the receiving apparatus over a second communications path; selecting data packets stored in the transmit buffer for compression based on a compression rate value and a transmission rate value of the transmitting apparatus and a decompression rate value received from the receiving apparatus; compressing the data packets selected for compression; and transmitting the data packets, by a first network interface, to the receiving apparatus over the first communications path.

A fifth aspect of this specification provides a method of receiving data from a transmitting apparatus, the method comprising: receiving a series of packets of data from the transmitting apparatus over a first communications path; storing uncompressed ones of the packets of data received over the first communications path in a receive buffer; decompressing compressed ones of the packets of data received over the first communications path and providing the resulting decompressed packets of data to the receive buffer; and sending a decompression rate value to the transmitting apparatus over a second communications path.

A sixth aspect of this specification provides a computer program comprising computer readable instructions that, when executed by a computing apparatus causes the computing apparatus to perform the method of the fourth or fifth aspect.

BRIEF DESCRIPTION OF THE DRAWINGS

So that the invention can be fully understood, embodiments thereof will now be discussed with reference to the accompanying drawings, in which.

DETAILED DESCRIPTION

Figure 1:
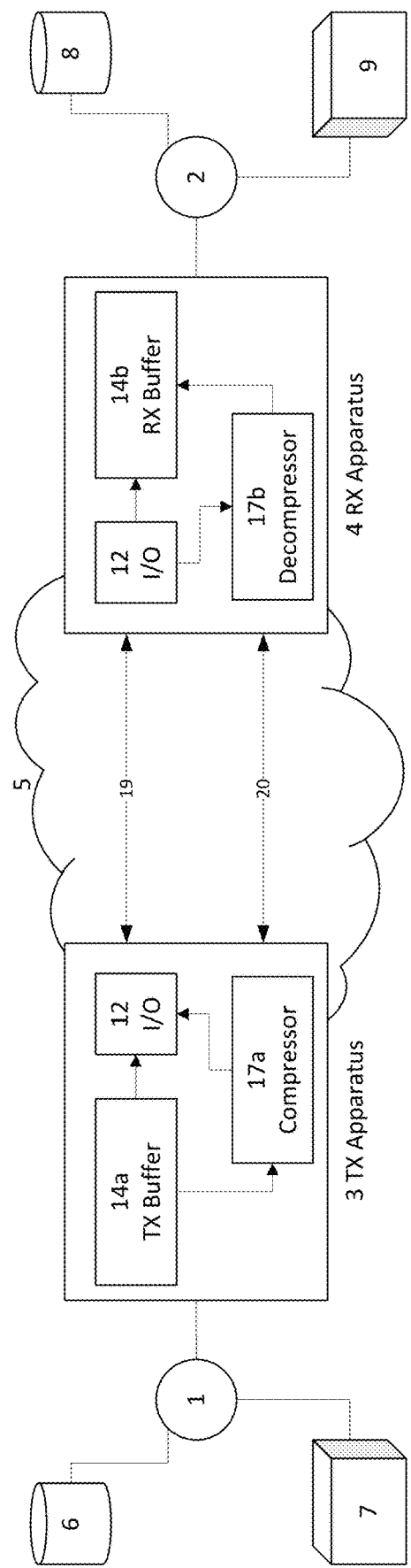
FIG. 1 is network diagram.

Embodiments described in this specification relate to the management of compression and transmission of a packetised data stream. Parameters relating to the compression and transmission characteristics of the transmitting apparatus and the decompression characteristics of the receiving apparatus are taken into account to select packets from the packet stream for compression.

The purpose of the transmitter node and receiver node is to provide a conduit for transferring data from one location to another at the optimal rate, where compression is used as a tool to improve the perceived throughput between the devices, providing a benefit under all influencing factors. Maximum throughput can only be as fast as the input to the transmitter node, the link between the nodes or the output of the receive buffer, whichever is the slowest.

Packets of data to be compressed are selected from a stream of data entering a transmit buffer from a given source. These selected packets are compressed by a compression engine in parallel to the transmit buffer to avoid disrupting the flow of any unselected packets that will be transmitted in their original state. Compressed packets are re-introduced to the packet stream at the head of the transmit buffer to be the next packet to be transmitted by a transmission engine. The order in which packets in the stream are processed by the transmission engine, containing both compressed and uncompressed packets, may be different from the original order of packets received from the source into the system. This is because the system latency of the compression process differs from the system latency of transmission. If the compression of a data set is much faster than the current transmission rate, then the compressed data will jump ahead of queued packets in the transmit buffer. Alternatively, if the compression process is much slower than the current transmission rate then more packets will be transmitted in the time it takes to compress the data, making the compressed data fall behind relative to its original position in the data sequence.

The transmitted packet stream is then received at a receiving node. Non-compressed packets are received and passed directly to the receive buffer for processing while compressed packets are decompressed by a decompression engine in the receiver node. Like the compression engine in the transmitter node, the decompression engine works in parallel to the receiver engine so that neither can slow the other down. After decompression, the decompressed packets are provided to a receive buffer. Compressed packets will be delayed for the duration that the decompression engine is processing them. As a result, packets that were not compressed by the transmission node will enter the receive buffer before the decompression engine has completed decompression of a packet. The slower the decompression engine is, relative to the receive rate, the more packets will enter the receive buffer before decompression is complete.

FIG. 1 depicts a system according to embodiments of the specification. In this particular example, the system includes a local Storage Area Network (SAN) 1, and a remote SAN 2. The remote SAN 2 is arranged to store back-up data from clients, servers and/or local data storage in the local SAN 1.

Two bridges 3, 4, associated with the local SAN 1 and remote SAN 2 respectively, are connected via a path 5. The bridges 3, 4 are examples of network nodes. The path 5 provides a number of physical paths between the bridges 3, 4. In this particular example, the path 5 is a path over a wireless or wired IP network and the bridges 3 and 4 communicate with each other using the Transmission Control Protocol (TCP). The communication paths between the bridges 3, 4 may include any number of intermediary routers and/or other network elements. Other devices 6, 7 within the local SAN 1 can communicate with devices 8 and 9 in the remote SAN 2 using the bridging system formed by the bridges 3, 4 and the path 5.

Figure 2:
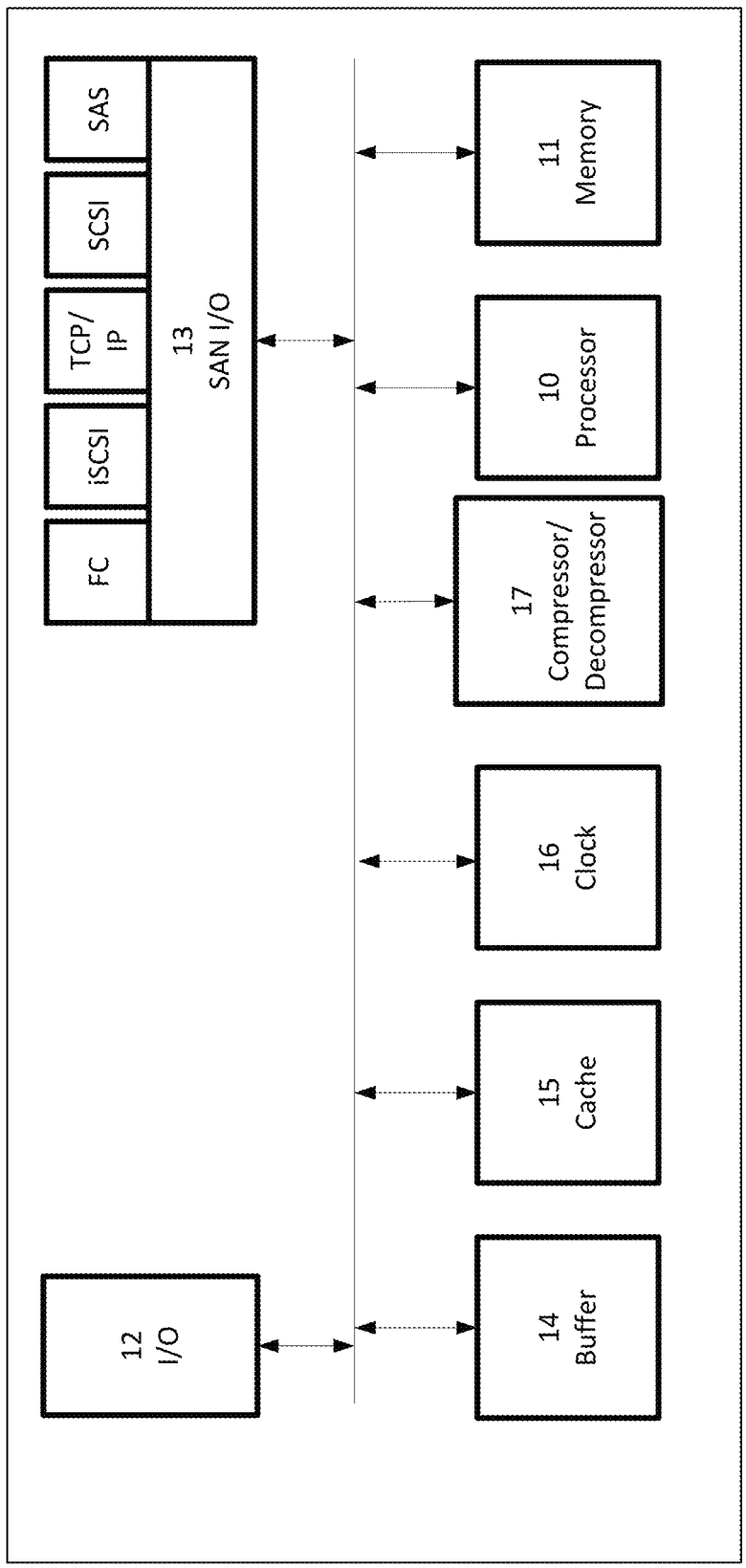
FIG. 2 is a schematic block diagram of transmitter and receiver nodes.

FIG. 2 is a block diagram of the local bridge 3. The bridge 3 comprises a processor 10, which controls the operation of the bridge 3 in accordance with software stored within a memory 11, including the generation of processes for establishing and releasing connections to other bridges 4 and between the bridge 3 and other devices 6, 7 within its associated SAN 1.

The connections between the bridges 3, 4 utilise one or more I/O ports 12, which is a physical port over which data is transmitted and received. One or more I/O ports 13 may also be provided for communicating with the SAN 1. The I/O ports 13 operate independently of, and are of a different type and specification to, the ports 12. The bridge 3 can transmit and receive data over multiple connections simultaneously using the port 12 and the I/O Port 13. The method in which data is transmitted and received through the IO port 13 can be one or more different protocols, including, but limited to FC, iSCSI, SCSI, SAS or TCP/IP. The bridge 3 may comprise one or more wireless transceivers and antennas (not shown) to allow communication over a wireless network.

One or more buffers 14 (including transmit and receive buffers) are provided for storing data for transmission by the bridge 3. A plurality of caches 15 together provide large capacity storage while a clock 16 is arranged to provide timing functions. A data compressor/decompressor 17 is also provided as either a hardware or software module to selectively compress data packets that are stored in the buffer 14 prior to transmission or to decompress compressed data packets received over the path 5. The processor 10 can communicate with various other components of the bridge 3 via a bus 18.

The memory 11 stores software (computer program instructions) that, when loaded into the processor 10, control the operation of the local bridge 3. The software includes an operating system and other software, for instance firmware and/or application software.

The computer program instructions provide the logic and routines that enable the local bridge 3 to perform the functionality described below. The computer program instructions may be pre-programmed into the local bridge 3. Alternatively, they may arrive at the local bridge 3 via an electromagnetic carrier signal or be copied from a physical entity such as a computer program product, a non-volatile electronic memory device (e.g. flash memory) or a record medium such as a CD-ROM or DVD. They may for instance be downloaded to the local bridge 3, e.g. from a server.

The processor 10 may be any type of processor with processing circuitry. For example, the processor 10 may be a programmable processor that interprets computer program instructions and processes data. The processor 10 may include plural processors. Each processor may have one or more processing cores. The processor 10 may comprise a single processor that has multiple cores. Alternatively, the processor 10 may be, for example, programmable hardware with embedded firmware. The processor 10 may be termed processing means. The logical Bridge 3 could be running on a system provided by a virtual machine, such as VMware, Hyper V, KVM or Xen, where the virtual machine server will provide a portion of the available processing power to the logical Bridge 3.

The remote bridge 4 is configured similarly to the local bridge 3, and FIG. 2 and the above description applies also to the remote bridge 4.

The term 'memory' when used in this specification is intended to relate primarily to memory comprising both non-volatile memory and volatile memory unless the context implies otherwise, although the term may also cover one or more volatile memories only, one or more non-volatile memories only, or one or more volatile memories and one or more non-volatile memories. Examples of volatile memory include RAM, DRAM, SDRAM etc. Examples of non-volatile memory include ROM, PROM, EEPROM, flash memory, optical storage, magnetic storage, etc.

Referring again to FIG. 1, a transmit buffer 14a in the transmitter node 3 is used to store data packets submitted to the system by a source. This buffer is used to keep a sequential order of data to be transmitted by the transmission engine. Packets are supplied to the transmit buffer 14a at one end and the transmission engine removes packets at the other end. On its own, if there were no compression engine 17a involved, this arrangement would act as a simple first-in-first-out (FIFO) buffer to supply the transmission engine, causing all transmitted data to be completely ordered relative to the source. In this system, the compression engine 17a removes data packets from any position in the transmit buffer 14a for processing. Furthermore, the transmit buffer 14a can be dynamically resized while the system is running and while data is present within it.

Many external factors can affect the rate of transmission. These factors include latency, packet loss or network congestion. Fluctuations in the rate of transmission from the transmitting node will cause the transmit buffer 14a to fill and empty periodically. In addition, the source may not be able to supply data into the transmit buffer at a consistent rate. In this scenario the transmit buffer 14a can also periodically empty and fill without warning.

The requirement of the receive buffer 14b is to ensure that the data packets from the network are reassembled and processed in the same order as the original source at the transmission node 3. With this constraint in place, only the next data packet in the original sequence is allowed to leave the receive buffer 14b, meaning that if empty spaces forms in the head of the receive buffer 14b as a result of packets being out of sequence during transmission then the receiver node 4 has to wait for that data packet to arrive before being able to continue processing data within the receive buffer 14b. During this scenario the receiver node 4 will continue to receive data until the receive buffer 14b is full.

With this in mind, it is important that the receive buffer 14b is used as efficiently as possible to keep the performance of data transfer through the entire system optimal. To achieve this a constant flow of data into and out of the receive buffer 14b must be maintained whenever possible.

Since the receive buffer has a dependency and key function to ensure that data exits the system in the same order that it arrived to the transmit node 3, it is vulnerable of stalling when the next data packet due to exit hasn't arrived into it yet. Stalling in this manner can cause a concertina effect where data backs up through the entire system filling all buffers. This type of stoppage is highly detrimental to the overall performance of the system.

The size of the receive buffer 14b is finite and so is able to be completely filled. When this happens, any new packets will be rejected, causing them to require retransmission from the transmit node 3. As a result, not only will this use additional bandwidth between the two nodes but also, by the time the retransmitted packet arrives to the receiver node 4 the receive buffer 14b may have stalled, waiting for the retransmitted packet as it is the next due to exit the system.

As described previously, the compression engine 17a has the ability to remove data from any position within the transmit buffer 14a. The position that a data packet is removed from the transmit buffer 14a has a direct impact on the operation of the receive buffer 14b, particularly if a selected packet becomes so out of sequence that it causes one of the problems described above. If a packet is selected too far back from the transmit engine it will be compressed and transmitted too far ahead in the data sequence causing many empty spaces to form in the receive buffer and possibly become dropped and retransmitted. Alternatively, if a data packet is selected too close to the transmit engine then it can fall so far behind in the data sequence that it causes a stall in the receive buffer 14b because it is waiting for this compressed packet.

Data is removed from the transmit buffer 14a within the transmitting node 3 to be processed by the compression engine 17a. The position of the data chosen for compression is calculated so that the end result is such that once the data has been compressed, transmitted and decompressed it arrives at the receive buffer 14b in sequence with the uncompressed packets.

Simply put, the slower the compression/decompression engine can process data, the further back from the output of the transmit buffer 14a is the data selected by the compression engine 17a.

The compression and transmission characteristics of the transmitting apparatus and the decompression characteristics of the receiving apparatus are taken into account when determining which packets are to be compressed.

As such, the selection of packets is managed so that transmission and compression constraints do not adversely affect the transfer of the data stream from the transmitting apparatus to the receiving apparatus and the handling of received packets at the receiving apparatus.

Embodiments of the invention effectively select packets from the data stream for compression based on performance parameters of the system. For example, compression and transmission parameters of the data transmitter and decompression parameters of the receiver are analysed so that compression and decompression of data packets do not interfere with the overall system performance.

Figure 5:
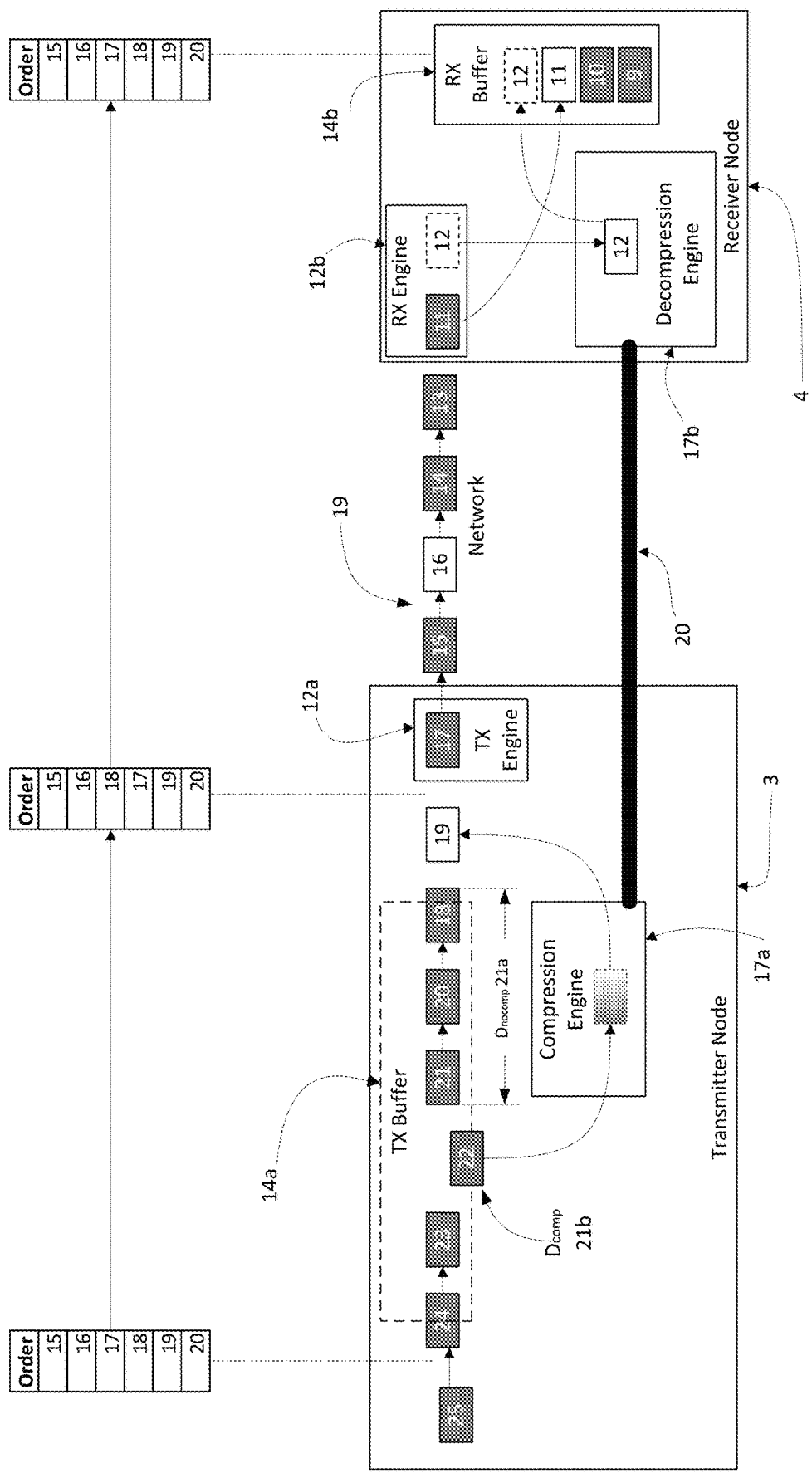
FIG. 5 is block diagram illustrating transmission of a data stream.

FIG. 5 shows a stream of packets being transmitted from the transmitting apparatus 3 to the receiving apparatus 4. The portion of the stream shown in FIG. 5 contains packets numbered 9 to 25. As can be seen, packets numbered 12, 16, 19 have been compressed and packet number 22 has been selected for compression by the compression module 17a. Because packets numbered 12, 16, 19 have been compressed, these packets are not transmitted in their logical position. However, after each compressed packet has been decompressed, it is sent to the receive buffer in its logical position. As such, some of the packets can be compressed without interfering with the overall performance of the system. This can be done because the determination of which packets to compress is performed dependent on the compression and transmission characteristics of the transmitting apparatus 3 and the decompression characteristics of the receiving apparatus 4.

To avoid out of sequence data from causing flow control and therefore performance issues, the transmitting node 3 will need to calculate the correct value of $D_{nocomp}$ 21a, which is the amount of data back from the transmission engine that must be left to be transmitted in their original state before selecting the next packet for compression. This will allow the selected packet to jump ahead in logical sequence sufficiently so that decompression will delay it enough to enter the receive buffer 14b at the correct time. This provides the advantage of leaving little to no gaps in the buffer and so avoiding stalls in data flow and possible application errors.

If the compression rate ($R_c$) and the transmission rate ($R_t$) of the transmitting apparatus 3 and the decompression rate ($R_d$) of the receiving apparatus 4 are known then the amount of data from the transmission engine ($D_{nocomp}$ 21a) within the transmit buffer can be calculated to determine the interval (in terms of data) between the transmission module 9 and the ideal data packet to compress:

$$Dnocomp = \left(\frac{Dcomp}{Rc} + \frac{Dcomp}{Rd}\right) R_t \qquad (1)$$

As such, expression 1 is used to identify which packets within the stream are to be compressed, where $D_{comp}$ 21b is the size of a given packet to be selected for compression. The size of $D_{comp}$ 21b can differ for every packet in the transmit buffer 14a.

The result of this is to cause the compressed data to be transmitted slightly ahead of its original position in the sequence, then after the compressed packet has been decompressed by the decompression engine 17b it will be inserted in the receive buffer 14b in its correct sequential position with respect to the other packets, thereby preventing any type of data stalls.

As explained above, to make calculations such as $D_{nocomp}$ 21a the rate of decompression ($R_d$) is required. The rate of decompression is not a constant value, it depends on how compressible the data is and how many system resources are currently being used. Therefore, it is necessary to have a communication link 20 between the compression 17a and decompression 17b engines.

The communication link 20 between the compression engine 17a and decompression engine 17b may be made through the use of header/status information when sending or receiving data packets between the transmitter node 3 and receiver node 4. There is no limit to the information that can be carried across this communication link, including buffer fulfilment levels, data flow information or compression/decompression rates.

Using expression 1 above it can be seen that $D_{nocomp}$ 21a is directly proportional to the transmission rate. This means that if the transmission rate is high then so will be $D_{nocomp}$ 21a, which as a result will cause the selected packet for compression to be even further back from the transmission engine 9 than if the transmission rate were to be low.

If the transmission rate ($R_t$) increases above a transmission rate threshold it may be necessary to increase the size of the transmit buffer 14a in order to allow compression to occur without heavily compromising data ordering. Additionally, if the ingress of data into the transmission node 3 heavily fluctuates so that the transmit buffer 14a continuously empties and fills there may also be periods where there is not enough data in the buffer to meet the requirement set by $D_{nocomp}$ 21a. This fluctuation is referred to herein as the 'swing' of data fulfilment within the transmit buffer 14a. The system can avoid the data levels in the transmit buffer 14a decreasing lower than what is required by $D_{nocomp}$ 21a by increasing the size of the transmit buffer 14a to accommodate for this swing. To achieve this, the size of the ingress data bursts will need to be taken into account when calculating the new required size of the transmit buffer 14a. This can be done by monitoring the ingress activity and determining a value of the data swing, which is calculated by subtracting the minimum amount of data within the buffer, from the maximum level that the buffer holds over a period of time. Doing this requires constant monitoring of ingress and egress rates as well as data levels within the buffer.

$$D_{tbuff} = D_{nocomp} + D_{swingmax} \qquad (2)$$

This solution for data with high bursting properties can only be achieved while there is memory available to increase the size of the transmit buffer 14a.

To overcome a higher level of data swing, and to level out the memory requirements between the transmitter node 3 and receiver node 4 it is possible to increase the size of the receive buffer 14b and allow for data packets to become out of sequence in a controlled manner. By allowing some data packets to become out of sequence within the size of the receive buffer 14b there will be no ill effect of data throughput and stalls in the system can be avoided, while still benefiting from compression of data packets.

As stated above, the maximum data throughput rate can only be as fast as the source, the link between the nodes or the output of the receive buffer, whichever is the slowest. Taking this into consideration it is important that the slowest part of the system is flowing as consistently as possible so that maximum throughput is achieved.

In situations where the source is the slowest section, the system must make sure that there is always space in the transmit buffer 14a for new incoming data, particularly if the input data bursts at a high rate.

Where the link between the nodes is the slowest section, the system must make sure that there is always space in the receive buffer to receive everything that has been transmitted, including any out of sequence packets. It must also ensure that data is not too far out of sequence that it will be dropped due to not having enough buffer space available. Finally, the system should ensure that as much data is compressed as possible so that the perceived bandwidth is at its highest.

Where the output of the receive buffer 14b is the slowest, the system can make sure that there is always data in the receive buffer 14b to output. This includes making sure empty spaces do not form at the output end of the receive buffer 14b, caused by data being too far out of sequence.

The rate that the receive buffer 14b can offload data ($R_{off}$) can be used with the rate of transmission to calculate the rate in which the receive buffer 14b will fill ($R_{rfill}$):

$$R_{rfill} = \mathrm{MAX}(R_t - R_{off}, 0) \qquad (3)$$

Where a negative result simply means that the receive buffer 14b will remain empty, $R_{rfill}$ becomes 0.

The rate that the receive buffer 14b is offloaded is known by the transmitter node 3 through the communication link between the compression and decompression engines 17a, 17b explained above. Using this information it can be calculated how much data will be in the receive buffer 14b from the transmitter node 3 at a given data point:

$$D_{rbin} = \left(\frac{R_{rfill}}{R_t}\right) D_{cont} \qquad (4)$$

Where $D_{cont}$ is the amount of continuous data that has been supplied by the source. If $R_{off}$ is higher than $R_t$ then it can be seen that $D_{rbin}$ will always be zero.

The size of the receive buffer 14b ($D_{rbuff}$) is also known by the transmitter node 3 through the communication link between the compression and decompression engines 17a, 17b explained above. With this information it is possible to calculate how much space will be left in the receive buffer 14b ahead of selecting data to compress in the transmit buffer 14a:

$$D_{rbuffleft} = D_{rbuff} - D_{rbin} \quad (5)$$

From this the amount that data can be out of sequence can be seen as:

$$D_{out} \leq D_{rbuff} - D_{comp} - D_{rbin}$$

Using the formula above, if the rate that data is offloaded from the receive buffer 14b is greater than the transmission rate then $D_{rbin}$ will equate to zero, always leaving the entire space of the receive buffer available for an out of sequence payload. Otherwise $D_{rbin}$ will increase until it is the same size as the receive buffer 14b meaning that nothing can be compressed out of sequence until the data stream is stopped by the source from entering the transmission node 3.

All of this allows the system to violate the $D_{nocomp}$ calculations when searching for the next data packet to compress so that more compression can be achieved.

Based on this, the size of the receive buffer 14b can be increased if a large data swing is required, thus improving the efficiency of the system:

$$D_{rbuff} \geq D_{out} + D_{compmax} + D_{rbin} \quad (6)$$

Where $D_{rbuff}$ is the size of the receive buffer 14b, $D_{out}$ is the amount of out of order data that is required given the size of data swing by the source and $D_{compmax}$ is the maximum size of a single packet of data that can be compressed.

As stated above, there are internal and external events that can influence the performance of one or both engines. These events include network packet loss, congestion, change in network latency, spike in CPU usage by other systems, low available memory or even the quality of the data. For this reason, it is important that the system is constantly monitored, so that quick modifications can be made, such as the size of the transmit buffer, the perceived network or compression performance.

Taking everything into consideration, it is possible that only a small percentage of data is selected for compression, or every packet, or anywhere in between. This depends on the rate at which the hardware can compress the data, the performance of the transmission link and how quickly data can be decompressed at the receiver node.

In addition to the selection process, the compression engine 17a has the ability to decide whether to compress the data or not. If it is decided that the data is not very compressible, then it has the ability to not compress it and put the data back where it originally was in the transmit buffer 14a, or at the head of the queue to be transmitted if this position is no longer available.

The transmission engine has the ability to transmit either compressed or non-compressed data and, as stated above, the compression engine can also supply the smallest payload meaning the system will always try to send as little data as possible without slowing the overall perceived throughput.

Given that data that enters the transmission engine can be either compressed or not compressed, the transmission engine needs to have the ability to mark packets as to their type and format prior to transmission. This is required so that the receiver engine within the receiver node can correctly identify compressed packets to be sent to the decompression engine 17b. To achieve this, the protocol between the two nodes has a packet header used to describe the data, which includes details about the compressed state of the payload.

The nature of the system is such that there will always be a difference in performance between the transmission engine and the compression engine 17a. In addition, this difference will never be constant, for example, momentary network congestion will temporarily slow the transmission engine. In such an event it is important that the compression engine 17a is still able to perform to its maximum potential so that the benefits of the engine are maintained. This is the reason that the two engines are situated in parallel with each other, so that they can run independently of each other.

By allowing the compression engine to remove data blocks from different positions of the transmit buffer, at the same time, the compression engine and the transmission engine can process data from the transmit buffer without impeding the other.

This means, for example, that if the compression engine is slower than the transmission engine then the compression engine will not be able to keep up with the transmission engine and so some data blocks will be transmitted uncompressed. Alternatively, if the compression engine is much faster than the transmission engine then all of the data blocks that are transmitted will be the smallest possible payload. In either case the resulting performance will be that of the transmission engine plus any possible gain that the compression can offer.

Figure 3:
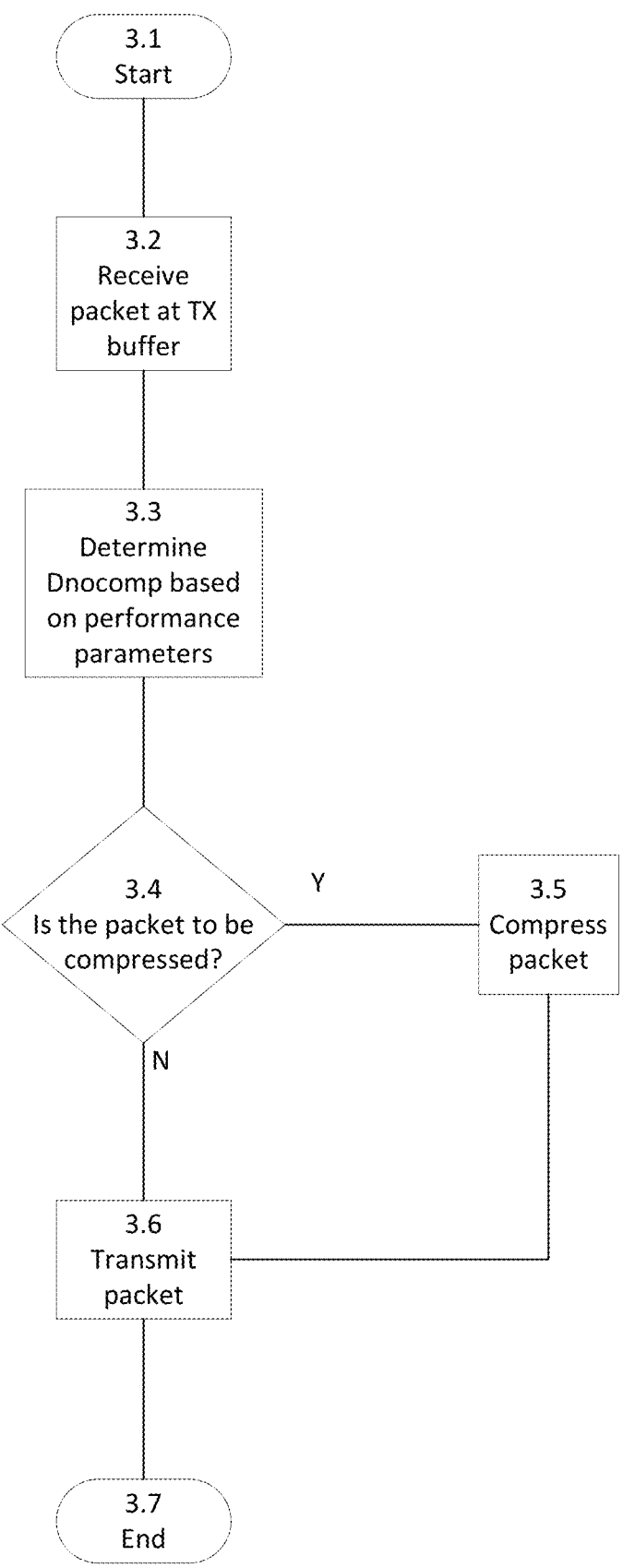
FIG. 3 is a flow chart illustrating steps taken at a transmitter node.

FIG. 3 is a flow chart illustrating operations performed at the transmitting apparatus or bridge 3.

The process starts at step 3.1. A stream of data packets is received at the transmit buffer 14a in its logical order at step 3.2. In other words, the packet n+1 is in the position i+1 within the packet stream and follows directly behind packet n which is in position i within the packet stream.

At step 3.3, the processor 10 determines a value for $D_{nocomp}$ based on the performance characteristics of the transmitting apparatus 3 and the receiving apparatus 4. $D_{nocomp}$ is the interval in the data stream between the data packet at the transmission module (in this case the interface 12) and the optimal data packet that is to be compressed so that the compressed data packet may be reintroduced into the data stream at the receiving apparatus 4 without causing excessive delay in data processing. $D_{comp}$ is the length of the current packet being considered for compression, this value is important because it will dictate the amount of time that it will be within the compression engine 17a based on the compression rate.

At step 3.4, it is determined whether a particular packet in the data stream in the transmit buffer 14a is to be compressed. If the packet is identified as the packet next packet to be compressed, then the packet is compressed at step 3.5 and is transmitted over the first communications link 19 at step 3.6. If the packet is not identified as the next packet to be compressed at step 3.4, then the packet is not compressed and is transmitted uncompressed at step 3.6. The process ends at step 3.7.

Figure 4:
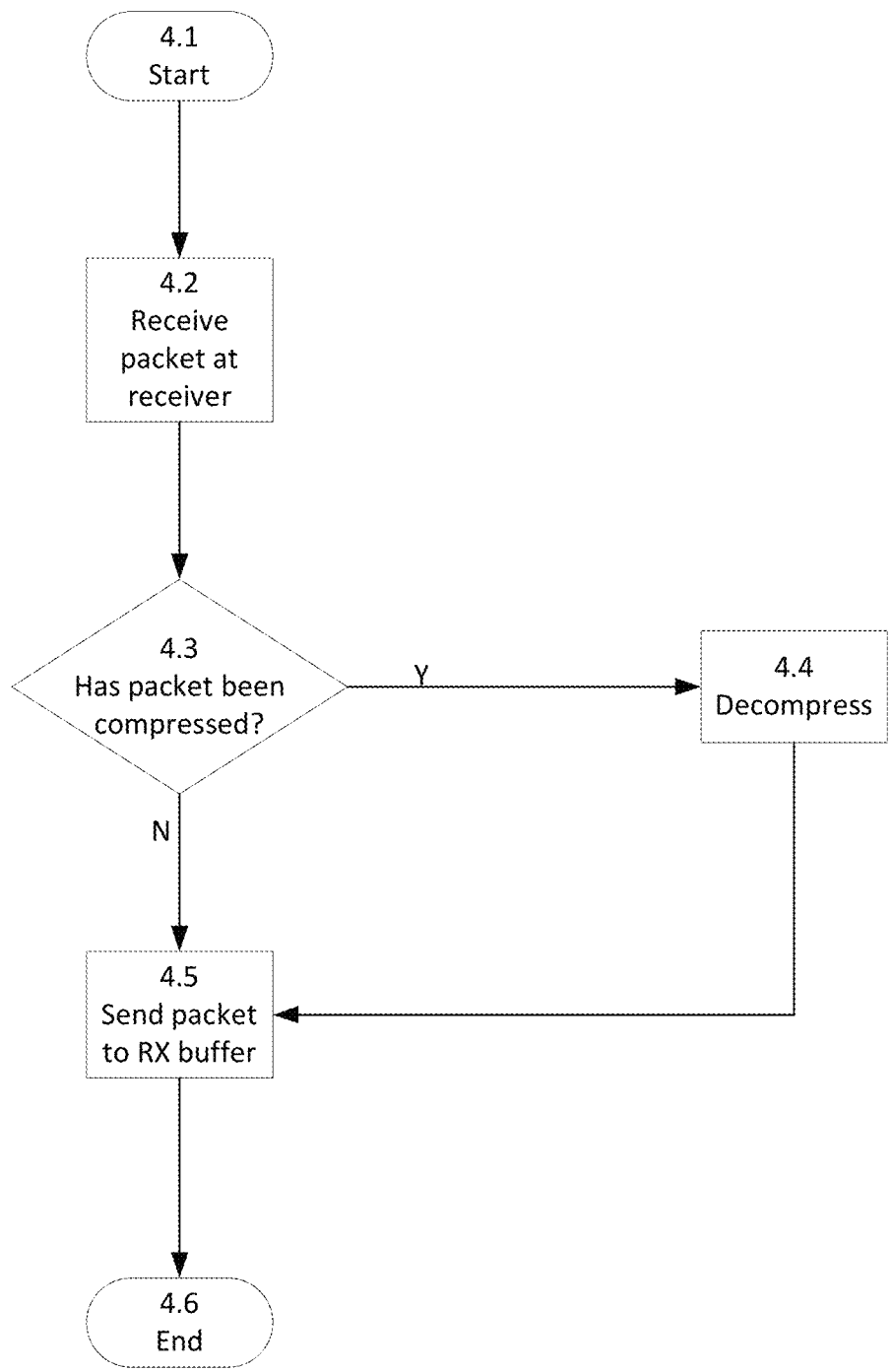
FIG. 4 is a flow chart illustrating steps taken at a receiver node.

FIG. 4 is a flow chart illustrating operations performed at the receiving apparatus or bridge 4. The process starts at step 4.1. At step 4.2, a packet is received at the port 12. At step 4.3, it is determined whether the packet has been compressed. If it is determined that the packet has been compressed then the packet is decompressed at step 4.4. The decompressed packet is then sent to the receive buffer 14b at step 4.5.

If it is determined at step 4.3 that the data packet was not compressed then the process continues to step 4.5 and the packet is sent to the receive buffer 14*b*.

Figure 6:
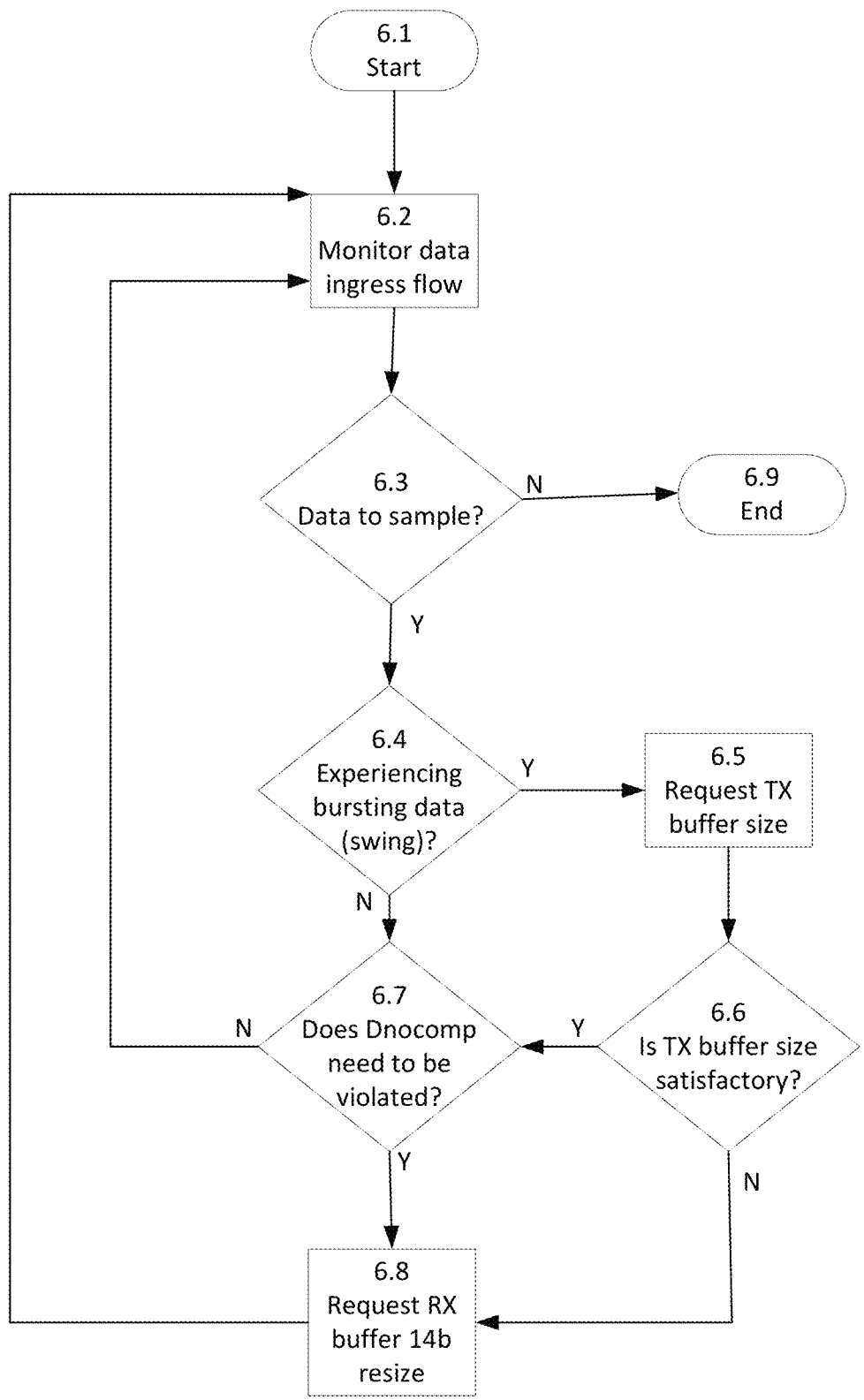
FIG. 6 is a flow chart illustrating data swing.

FIG. 6 is a flow chart illustrating the process taken in managing and resizing the transmit buffer 14*a* and receive buffer 14*b*. The process starts at 6.1.

At step 6.2 the ingress data flow into the transmit buffer 14*a* is monitored over a period of time. At 6.3 it is determined if there is any data to sample. If there is data to sample, the process moves on to 6.4. At 6.4 the flow is examined to determine if it is bursting, giving a data swing value. If there is sufficient swing to require the transmit buffer 14*a* to be increased then the process moves on to 6.5, otherwise the process proceeds to 6.7. At 6.5 the transmit buffer 14*a* is requested to be changed to compensate for the amount of data swing. At 6.6 the resized transmit buffer 14*a* is examined to see if it meets the requirement set by the data swing. If the size is not enough then this means that $D_{nocomp}$ may need to be violated, meaning an increase in the receive buffer 14*b* size, moving on to 6.8. If at 6.6 the transmit buffer is large enough to compensate for the level of ingress data swing then the process moves on to 6.7. At 6.7 the data ingress and performance of the transmission engine is examined to see if $D_{nocomp}$ will need to be violated to achieve compression. If $D_{nocomp}$ will need to be violated then the process moves on to 6.8 at which a request is made to resize the receive buffer 14*b*. If $D_{nocomp}$ will not need to be violated then the process proceeds to 6.2 to resample the data ingress. At 6.8 the receive buffer 14*b* is requested to be changed to compensate for $D_{nocomp}$ being violated, causing data packets to be received out of order. The process then moves on to 6.2 to resample the ingress data flow. When there is no more data to be sampled, the method ends at step 6.9.

The method in which the system described herein uses compression to increase the perceived data throughput ensures that the path utilisation never drops below 100% of what is available before compression is applied, even with a fast network interface. This means that the compression engine is always providing an advantage to the overall system regardless of the state of the transmission path, system resources or data compressibility.

The system described herein also accommodates data patterns that fluctuate in terms of containing compressible and non-compressible data within the same packet stream. Because of the way in which the system operates there are no external configurations or performance tuning inputs that are required.

Using the system described herein provides a data conduit where the perceived throughput will not drop below the rate available from the path between the two nodes.

What is claimed is:

1. A transmitting apparatus for transmitting data to a receiving apparatus, the transmitting apparatus comprising:
   - a first network interface that transmits data to the receiving apparatus over a first communications path;
   - a transmit buffer that stores packets of data for transmission by the first network interface over the first communications path, the packets of data being arranged in a series of data packets with first and second ends, the first network interface removing packets from the second end of the series of data packets;
   - a data compressor, arranged in parallel to the transmit buffer, that selectively compresses the packets of data stored in the transmit buffer; and
   - a second network interface that receives a decompression rate value from the receiving apparatus over a second communications path;

wherein the transmitting apparatus is configured:
   - to select a first data packet stored in the transmit buffer based on a compression rate value and a transmission rate value of the transmitting apparatus and the decompression rate value received from the receiving apparatus via the second network interface, the first data packet being located at a position in the series of data packets that is further from the second end of the series of data packets than a position in the series of data packets of a second data packet;
   - while the second data packet remains in the transmit buffer without being compressed, to remove the first data packet from the transmit buffer and cause the data compressor to compress the first data packet; and
   - to cause the compressed first data packet to be transmitted by the first network interface before transmission by the first network interface of the uncompressed second data packet.

2. Apparatus as claimed in claim 1, wherein the data compressor determines whether a compressed size of a particular data packet exceeds an uncompressed size of the data packet.

3. Apparatus as claimed in claim 1, configured to vary a transmit buffer size.

4. Apparatus as claimed in claim 3, wherein the apparatus is configured to vary a size of the transmit buffer dependent on the compression rate value and the transmission rate value.

5. Apparatus as claimed in claim 3, wherein the apparatus is configured to vary a size of the transmit buffer in response to a determination that a buffer swing is above a predetermined threshold.

6. Apparatus as claimed in claim 3, wherein varying the transmit buffer size comprises increasing the transmit buffer size in response to a determination that the transmission rate value is above a transmission rate threshold.

7. Apparatus as claimed in claim 1, wherein the apparatus is configured to cause a variation in a receive buffer size of the receiving apparatus.

8. Apparatus as claimed in claim 7, wherein the variation in the receive buffer size is based on a rate at which the receive buffer is able to offload received data packets.

9. A receiving apparatus for receiving data from a transmitting apparatus, the receiving apparatus comprising:
   - a first network interface that receives a series of packets of data from the transmitting apparatus over a first communications path, the series of packets of data including plural compressed data packets including a first data packet, and plural uncompressed data packets including a second data packet, the first data packet being received prior to the second data packet;
   - a receive buffer forming part of the first network interface, the receive buffer having a head from which data packets can leave the receiving apparatus, wherein the receive buffer stores the uncompressed data packets received over the first communications path in an order in which the uncompressed data packets were received over the first communications path;
   - a data decompressor that decompresses the compressed data packets received over the first communications path to provide decompressed data packets, and provides the decompressed data packets to the receive buffer, wherein the decompressed first data packet is stored in the receive buffer after the second data packet and further from the head of the receive buffer than the second data packet; and a second network interface that sends a decompression rate value to the transmitting apparatus over a second communications path.

10. Apparatus as claimed in claim 9, wherein the receive buffer is resized in response to determining that a transmit buffer does not meet a size requirement.

11. A system comprising the transmitting apparatus of claim 1, and the receiving apparatus of claim 9.

12. A non-transitory computer-readable computer program product comprising instructions that, when executed by an apparatus, cause the apparatus to perform the following operations:

storing packets of data for transmission by a first network interface over a first communications path in a transmit buffer, the packets of data being arranged in a series of data packets with first and second ends, the first network interface removing packets from the second end of the series of data packets;

receiving a decompression rate value from a receiving apparatus over a second communications path;

selecting a first data packet stored in the transmit buffer based on a compression rate value and a transmission rate value of the apparatus and the decompression rate value received from the receiving apparatus, the first data packet being located at a position in the series of data packets that is further from the second end of the series of data packets than a position in the series of data packets of a second data packet;

while the second data packet remains in the transmit buffer without being compressed, removing the first data packet from the transmit buffer and causing compression of the first data packet; and causing the compressed first data packet to be transmitted, by the first network interface, to the receiving apparatus over the first communications path before transmission by the first network interface of the uncompressed second data packet.

13. A non-transitory computer-readable computer program product comprising instructions that, when executed by an apparatus, cause the apparatus to perform the following operations:

receiving a series of packets of data from a transmitting apparatus over a first communications path, the series of packets of data including plural compressed data packets including a first data packet, and plural uncompressed data packets including a second data packet, the first data packet being received prior to the second data packet;

storing the uncompressed data packets received over the first communications path in a receive buffer in an order in which the uncompressed data packets were received over the first communications path, the receive buffer having a head from which data packets can leave the apparatus;

decompressing the compressed data packets received over the first communications path to provide decompressed data packets, and providing the decompressed data packets to the receive buffer, wherein the decompressed first data packet is stored in the receive buffer after the second data packet and further from the head of the receive buffer than the second data packet; and sending a decompression rate value to the transmitting apparatus over a second communications path.

14. Non-transitory computer-readable computer program product as claimed in claim 12, wherein the instructions, when executed by the apparatus, further cause the apparatus to perform determining whether a compressed size of a particular data packet exceeds an uncompressed size of the data packet.

15. Non-transitory computer-readable computer program product as claimed in claim 12, wherein the instructions, when executed by the apparatus, further cause the apparatus to perform varying a transmit buffer size.

16. Non-transitory computer-readable computer program product as claimed in claim 15, wherein the instructions, when executed by the apparatus, further cause the apparatus to perform varying a size of the transmit buffer dependent on the compression rate value and the transmission rate value.

17. Non-transitory computer-readable computer program product as claimed in claim 15, wherein the instructions, when executed by the apparatus, further cause the apparatus to perform varying a size of the transmit buffer in response to a determination that a buffer swing is above a predetermined threshold.

18. Non-transitory computer-readable computer program product as claimed in claim 15, wherein varying the transmit buffer size comprises increasing the transmit buffer size in response to a determination that the transmission rate value is above a transmission rate threshold.

19. Non-transitory computer-readable computer program product as claimed in claim 12, wherein the instructions, when executed by the apparatus, further cause the apparatus to perform causing a variation in a receive buffer size of the receiving apparatus.

20. Non-transitory computer-readable computer program product as claimed in claim 13, wherein the receive buffer is resized in response to determining that a transmit buffer does not meet a size requirement.

* * * * *